United States Patent [19]
Takada et al.

[11] Patent Number: 5,661,416
[45] Date of Patent: Aug. 26, 1997

[54] INTERFACE CIRCUIT AND INTERFACE-NETWORK SYSTEM USING THE SAME

[75] Inventors: Yoshifumi Takada; Masakazu Yamamoto, both of Hadano, Japan

[73] Assignee: Hitachi, Ltd., Tokyo, Japan

[21] Appl. No.: 429,170

[22] Filed: Apr. 26, 1995

[30] Foreign Application Priority Data

May 2, 1994 [JP] Japan .................... 6-093288

[51] Int. Cl.$^6$ .................. H03K 19/0948; H03K 19/0185
[52] U.S. Cl. .................. 326/86; 326/30; 326/27; 326/58
[58] Field of Search .................. 326/83, 86, 80–81, 326/68, 112, 119, 121, 27, 57–58

[56] References Cited

U.S. PATENT DOCUMENTS

| | | | |
|---|---|---|---|
| 5,019,728 | 5/1991 | Sanwo et al. | 326/68 |
| 5,066,873 | 11/1991 | Chan et al. | 326/27 |
| 5,162,672 | 11/1992 | McMahan et al. | 326/86 |
| 5,311,083 | 5/1994 | Wanlass | 326/68 |
| 5,378,945 | 1/1995 | Partovi | 326/68 |
| 5,457,406 | 10/1995 | Takada . | |
| 5,485,107 | 1/1996 | Lacey et al. | 326/86 |

FOREIGN PATENT DOCUMENTS 4-225275  8/1992  Japan .

OTHER PUBLICATIONS

"The Increasing in the Interface Speed", M. Yamada, Institute of Electronics Information and Communication Engineers of Japan, vol. 76, No. 7, Jul. 1993, pp. 721–725.

*Primary Examiner*—Edward P. Westin
*Assistant Examiner*—Jon Santamauro
*Attorney, Agent, or Firm*—Fay, Sharpe, Beall, Fagan, Minnich & McKee

[57] ABSTRACT

An interface circuit includes at least one signal processing circuit connected to a transmission line which is equipped with a terminal circuit having a resistor with a terminal voltage applied to at least one terminal, and includes an input circuit for inputting from the transmission line a signal to be processed in the signal processing circuit, or an output circuit for outputting a processed signal to the transmission line or an input and output circuit for inputting and outputting a signal. The input circuit or the output circuit or the input and output circuit are incorporated in the signal processing circuit. The input circuit or the output circuit or the input and output circuit are directly connected to the transmission line, wherein the output circuit has a push-pull circuit which is directly connected to the transmission line to receive an output signal from the signal processing circuit and to have a constant output impedance which is independent of an output from the output signal. An interface system having a signal processing circuit having he interface circuit in an interface-network is disclosed. Based on the above structure, reflection noise which occurs in the interface-network system is absorbed, with an improved focusing of a waveform, and power consumption is minimized during high-speed signal transmission.

13 Claims, 7 Drawing Sheets

INTERFACE CIRCUIT AND INTERFACE-NETWORK SYSTEM USING THE SAME

BACKGROUND OF THE INVENTION

The present invention relates to an interface circuit for transmitting a logic signal in a control circuit of a computer or the like, and relates more particularly to an interface circuit of a bus system for carrying out a signal transmission between a plurality of input circuits and output circuits and between input and output circuits, and an interface-network using this interface circuit.

As an interface circuit to be used for a signal transmission between logic elements, there are interface circuits which use ECL (Emitter Coupled Logic), TTL (Transistor Transistor Logic) and CMOS (Complementary Metal Oxide Semiconductor), respectively. These interface circuits have been used differentially to meet specific performance requirements by taking into account circuit speed, power consumption, etc.

Presently, an interface circuit which is to be used mainly for a microprocessor system is required to have performance characteristics such as high-speed operation of at least 100 MHz, low voltage and low power consumption. As a new interface circuit which meets this requirement, an interface circuit called GTL (Gunning Transceiver Logic) has been proposed as disclosed in JP-A-4-225275. This GTL is an interface circuit which meets a terminal voltage of about 1.2 V to 2.0 V at the terminal of the bus-network and a low amplitude of about 1 V for a signal level, to thereby minimize power consumption during a high-speed operation.

In addition, there is U.S. Patent Application based on Japanese Patent Application No. 6-62778, the priority date of which is Mar. 31, 1994 entitled "Data Bus Circuit and Method of Changing over Termination Resistor of the Data Bus Circuit" by Kenji KASHIWAGI, et al. and assigned to the same assignee of this application, also, a U.S. patent application Ser. No. 08/031,854 filed on Mar. 16, 1993 entitled "Bidirectional Signal Transmission Circuit" by Yoshifumi TAKADA, et al and assigned to the same assignee of this application, the contents of which are incorporated herein by reference.

SUMMARY OF THE INVENTION

It is an object of the present invention to provide an interface circuit which requires only low power consumption during a high-speed operation and restricts a ringing (waveform distortion) to a minimum and an interface-network system using this interface circuit.

According to a first aspect of an embodiment of the present invention, an interface circuit has at least one signal processing unit connected to a transmission line which is equipped with a terminal circuit having a resistor with a terminal voltage applied to at least one terminal, and includes an input circuit for inputting from the transmission line a signal to be processed in the signal processing unit, or an output circuit for outputting a processed signal to the transmission line or an input and output circuit for inputting and outputting a signal. The input circuit or the output circuit or the input and output circuit are incorporated in the signal processing unit. The input circuit or the output circuit or the input and output circuit are directly connected to the transmission line, wherein the output circuit in a signal processing unit includes a push-pull circuit such that a signal for outputting to at least one signal processing unit is outputted to the transmission line regardless of an impedance of the terminal circuit and a characteristic impedance of the transmission line.

A power source voltage of the push-pull circuit may be set to be smaller than a power source voltage of an electronic circuit other than the push-pull circuit.

A power source voltage of the push-pull circuit may be set to be large than 60% of a terminal voltage of the terminal circuit.

A power source voltage of the push-pull circuit may be set to be equal to a voltage of the terminal circuit.

The push-pull circuit may be a structure of an n-channel MOS transistor.

The push-pull circuit may be a structure of a p-channel MOS transistor.

The n-channel MOS transistor which constitutes the push-pull circuit has a characteristic that this n-channel MOS transistor can select an output impedance of the n-channel MOS transistor in an on state, to which a power source voltage of the push-pull circuit has been applied, to be not larger than three times of a characteristic impedance of the transmission line. This is also applicable to p-channel MOS transistor.

The n-channel MOS transistor which constitutes the push-pull circuit has a characteristic that this n-channel MOS transistor can select an output impedance of the n-channel MOS transistor in an on state, to which a power source voltage of the push-pull circuit has been applied, to be equal to a characteristic impedance of the transmission line. This is also applicable to p-channel MOS transistor.

The interface circuit may have a DISABLE unit for disabling the output circuit from outputting a signal so that the output impedance of the push-pull circuit becomes a high impedance.

According to a second aspect of the embodiment of the present invention, an interface-network system has a transmission line, a terminal circuit having a resistor with a terminal voltage applied to at least one terminal, at least one signal processing unit connected to the transmission line, and an interface circuit including an input circuit for inputting from the transmission line a signal to be processed in the signal processing unit, or an output circuit for outputting a signal processed in the signal processing unit to the transmission line or an input and output circuit for inputting and outputting a signal to and from the signal processing unit. The input circuit or the output circuit or the input and output circuit are incorporated in the signal processing unit. The input circuit or the output circuit or the input and output circuit are directly connected to the transmission line, wherein the output circuit in a signal processing unit includes a push-pull circuit such that a signal for outputting to at least one signal processing unit is outputted to the transmission line regardless of an impedance of the terminal circuit and a characteristic impedance of the transmission line.

The terminal circuit is connected to one end of the transmission line, with the output portion of the push-pull circuit being connected to the other end of the transmission line, and a power source voltage of the push-pull circuit can be set to be equal to the terminal voltage which is applied to the terminal circuit.

At least the input and output circuit is connected to a first transmission line and this circuit can be connected to a second transmission line from the first transmission line through a connector.

Based on the above-described structure of the present invention, a reflection noise which occurs in the bus-network can be absorbed, waveform focusing is improved and a low power consumption can be achieved during a high-speed signal transmission.

DESCRIPTION OF THE PREFERRED EMBODIMENTS

Figure 1:
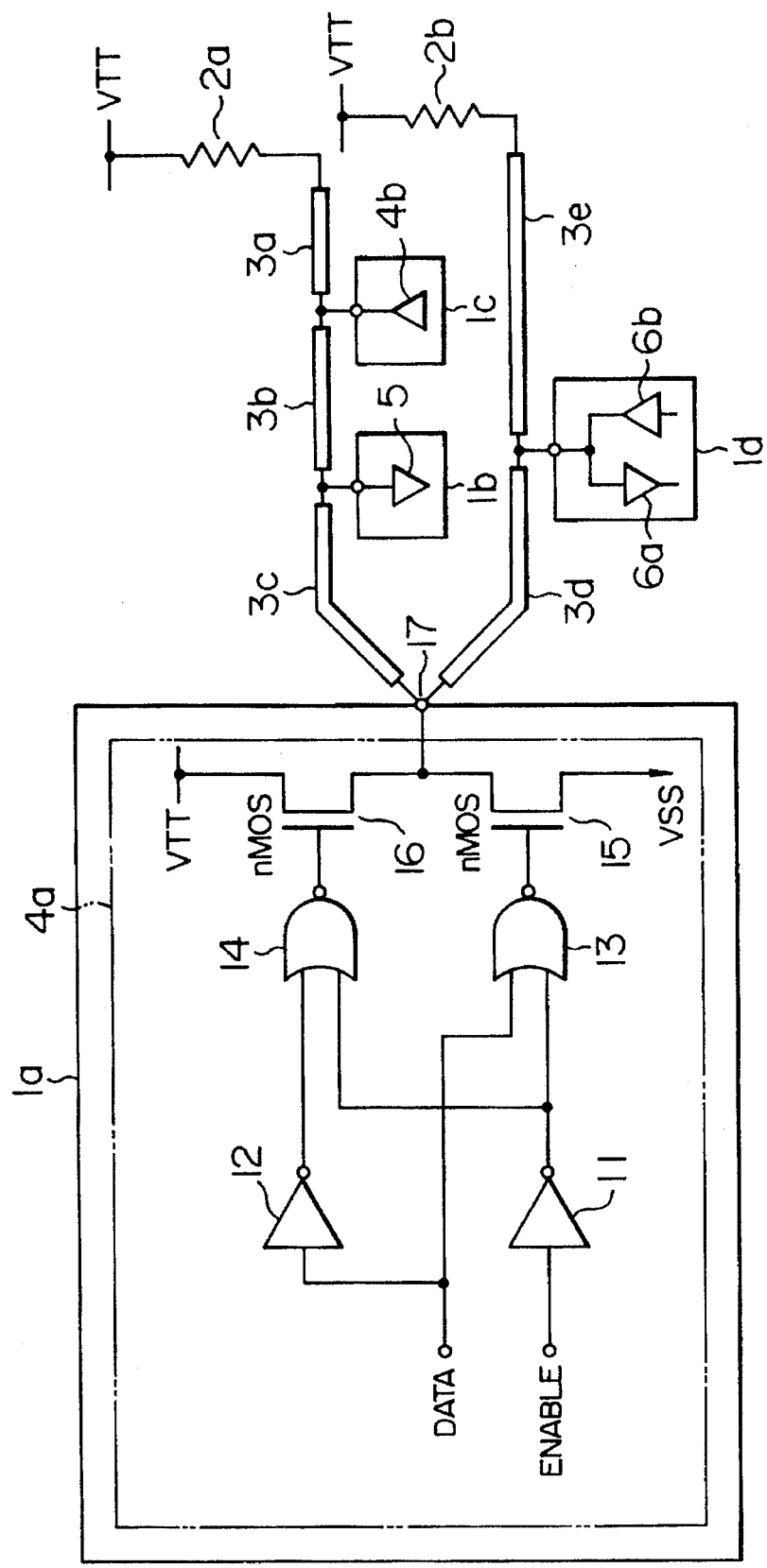
FIG. 1 is a structure diagram for showing the interface circuit according to the present invention and the interface-network system which uses this interface circuit.

An embodiment of the present invention will be explained below in detail with reference to the drawings. FIG. 1 shows a structure of an interface circuit which includes an output circuit according to the present invention. The interface circuit according to the present invention is mounted as a chip on the control circuit or the signal processing circuit of a computer or a printer, for example. This chip may be an output circuit for simply outputting a signal or data to another control circuit, or an input circuit for simply inputting a signal from the control circuit or an input and output circuit for inputting and outputting a signal. The interface circuit of the present embodiment is structured by a plurality of one-chip elements 1a to 1d, terminal resistors 2a to 2d and transmission lines 3a to 3e for connecting these one-chip elements and terminal resistor. A terminal voltage level of the transmission lines 3a to 3e is set to a terminal voltage VTT.

Output circuits 4a and 4b are provided for outputting a signal to the transmission lines 3a, 3b and 3c. Input circuit 5 for receives a signal from the transmission lines 3b and 3c and an input circuit 6a and an output circuit 6b having both functions of outputting and receiving a signal are connected to the transmission lines 3a to 3e through connection terminals of the one-chip elements 1a to 1d.

The structure of the output circuit 4a (this is also the same for 4b and 6b) of the present embodiment will be explained below. 11 and 12 designate inverters and 13 and 14 designate NOR gates. 15 and 16 designate N-channel MOSs which constitute a push-pull circuit. A drain of the NMOS 16 is connected to a power source voltage VTT (the same potential as the voltage VTT of the terminal circuit) and a source of the NMOS 15 is connected to VSS. The power source voltage VTT is set to a voltage (1.2 V, for example) which is lower than a circuit source voltage (VCC=3 V or 3.3 V, not shown) inside the one-chip element 4a or an element other than the NMOS transistors 15 and 16. With the above-described structure, power consumption can be minimized.

When an interface-network is structured as shown in FIG. 1 the output circuits 4b and 6b other than the output circuit 4a for transmitting a signal, for example, must not give an influence to the signal level of the transmission lines 3a to 3e. In other words, it is necessary to keep the transistors 15 and 16 of the push-pull circuit in an off state to have a high impedance. For this purpose, the output circuits 4a, 4b and 6b have ENABLE control signals for permitting a signal inputted to a terminal DATA to be outputted to a terminal 17. When a signal is not transmitted, the ENABLE signals of the output circuits 4a, 4b and 6b are set to a low level. Accordingly, the gates of the NMOS transistors 15 and 16 become low through the invertor 11 and the NOR gates 13 and 14 so that the NMOS transistors 15 and 16 are turned off to have a high impedance. Since the push-pull circuit can be set in a high impedance state as described above in the present embodiment, no bad influence is applied to the signal on the transmission lines 3a to 3e when a signal is not transmitted.

When the output circuit 4a transmits a signal, the ENABLE signal to be inputted to the terminal ENABLE is set to a high level. The transistors 15 and 16 of the push-pull circuits carry out a push-pull operation according to high or low of the terminal DATA. In other words, when the terminal DATA is high, the gate of the NMOS transistor 16 becomes high through the NOR gate 14 and the NMOS transistor 16 is turned on. The terminal 17 becomes high (voltage VTT) and high of the terminal DATA is outputted. When the terminal DATA is low, the gate of the NMOS transistor 15 becomes high through the NOR gate 13 and the NMOS transistor 15 is turned on, and low (voltage VSS) is outputted to the terminal 17. The terminal DATA and the terminal ENABLE receive data and ENABLE signals transmitted from the control circuit of the computer or the printer, for example.

Figure 10:
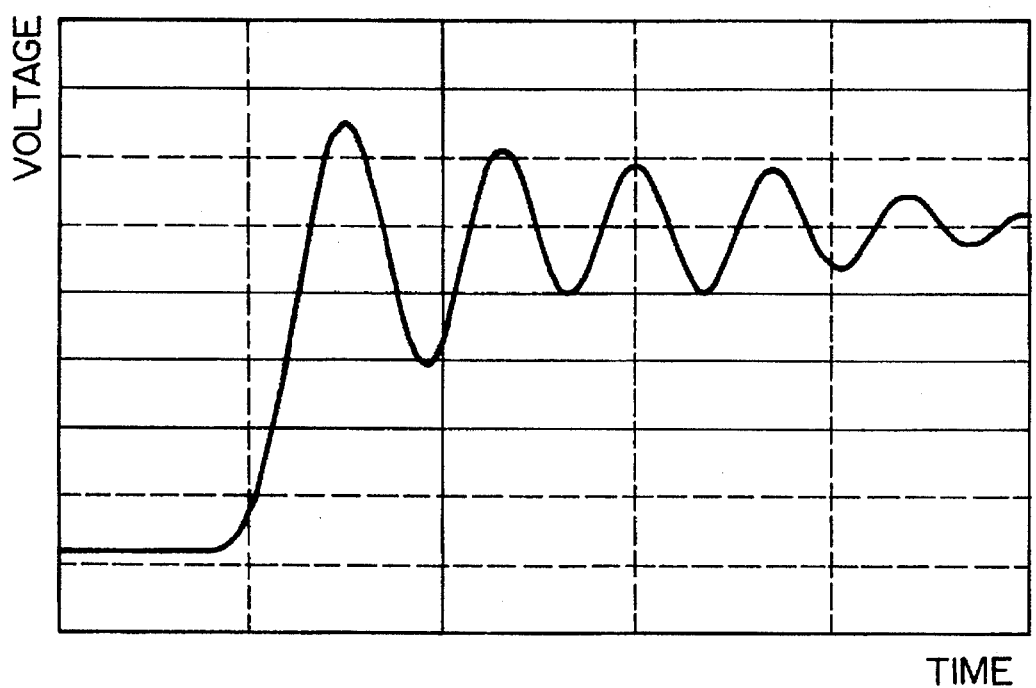
FIG. 10 is a reference diagram for explaining the output signal waveform of the interface circuit.

Since the output circuit 4a of the present embodiment has a push-pull circuit as described above, one of the transistors 15 and 16 is set to an on state without exception even if the output level is either high or low. Accordingly, the output circuit 4a has a certain constant output impedance. At the time when the transistors 15 and 16 are shifted from low to high, the energy of reflection noise which has occurred at each mismatched point of the interface-network is absorbed by the transistor 16 which is in the on state, with a result of a satisfactory focusing of the ringing of the waveform (an oscillation noise of the voltage waveform shown in FIG. 10).

When the power source voltage of the push-pull circuit is matched with a terminal voltage (about 1.2 to 2.0 V for VTT), the drain of the NMOS 16 becomes the voltage VTT and the source of the NMOS 16 becomes the voltage VTT when the terminal 17 is outputting high, so that no DC current flows through the push-pull circuit. Accordingly, the DC component of the power consumption of the interface circuit according to the present invention flows from the terminals (terminal voltage VTT) of the terminal resistors 2a and 2b to the terminal (voltage VSS) through the NMOS transistor 15. In other words, the DC component is generated only when low is being outputted (when the NMOS transistor 15 is on). When the transistor 15 is off and the transistor 16 is on when a signal is transmitted from the terminal 17 to the transmission lines 3c and 3d, power is not consumed when high is being outputted. Further, since the voltage VTT is lower than the voltage VCC, power consumption is relatively low. As a result, the present invention has an advantage of GTL (Gunning Transceiver Logic) which means that power consumption is low even during a high-speed operation.

Figure 2:
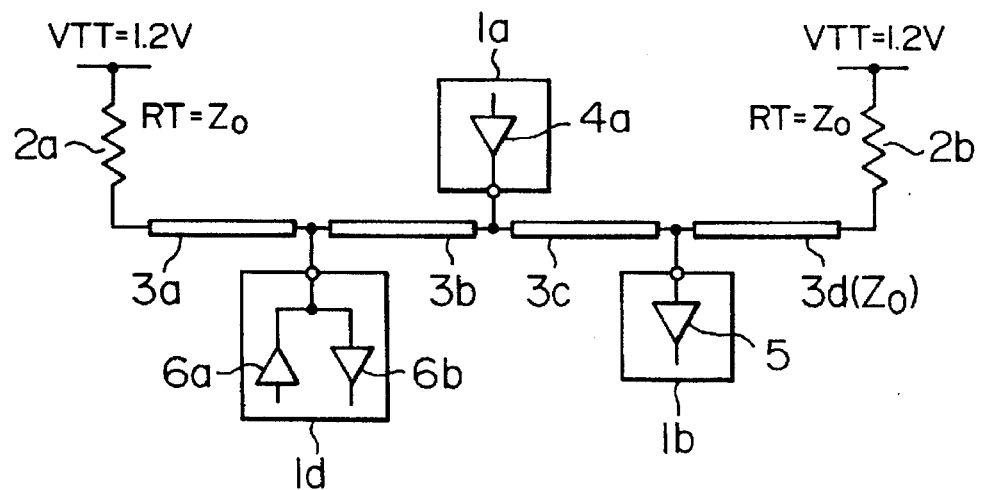
FIG. 2 is a structure diagram for showing a detailed example of the interface-network system to which the signal processing circuit having the interface circuit according to the present invention is connected.

FIG. 2 shows one example of an interface-network including the interface circuit of the present invention, having an output circuit 4a, an input circuit 5 and input and output circuits 6a and 6b connected to the interface circuit. In FIG. 2, terminal voltage levels of the transmission lines 3a to 3e are set to a terminal voltage VTT (1.2 V in GTL) through terminal resistor 2a and 2b (RT). This terminal resistor RT is equal to a characteristic impedance $Z_o$ and causes no reflection at the terminals of the transmission lines 3a and 3d.

In the output circuit 4a, the output impedance (RO) when the transistor 16 at the power source side of the push-pull circuit is on, is set equal to the characteristic impedance $Z_o$ of the transmission lines 3a to 3e so that a reflection signal is absorbed.

Further, in the present embodiment, the output impedance (RO) when the transistor 16 at the power source side of the push-pull circuit is on, is set to not higher than three times of the characteristic impedance $Z_o$ of the transmission lines 3a to 3e. When RO is set to be equal to 3 $Z_o$, a reflection coefficient is obtained to be $(RO-Z_o)/(RO+Z_o)=(3\ Z_o-Z_o)/(3\ Z_o+Z_o)=2\ Z_o/4\ Z_o=½$. In other words, a half of the energy of the reflection signal is absorbed by the output impedance which becomes RO=3 $Z_o$. Thus, noise focusing can be improved substantially by absorbing a half of the reflection signal.

Figure 3:
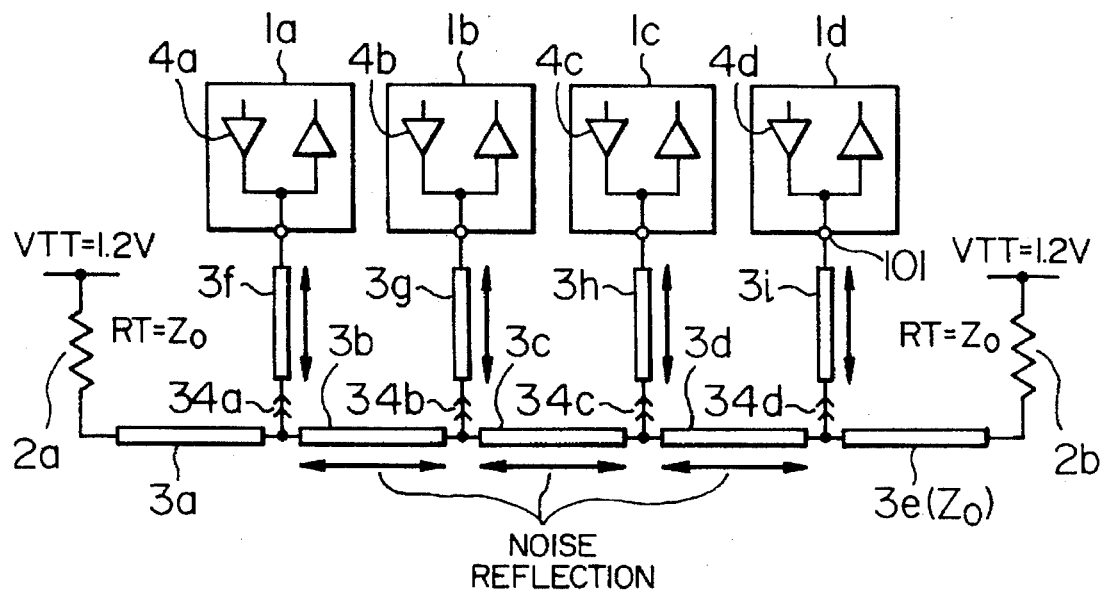
FIG. 3 is a structure diagram for showing another example of the interface-network system.

FIG. 3 shows an example of the case where a plurality of the same one-chip elements including the interface circuit of the present invention are connected to an interface-network through connectors 34a to 34d. This kind of interface-network is used for a computer or the like which has a plurality of one-chip elements. The output circuit 4a of the present invention explained in FIG. 1 is applied to the output circuits 4a to 4d within the one-chip elements 1a to 1d.

The one-chip elements 1a to 1d are connected to the transmission lines 3a to 3e through transmission lines 3f to 3i and the connectors 34a to 34d. Both ends of the transmission lines 3a to 3e are connected to the terminal resistors 2a and 2b and are set to the terminal voltage VTT. The one-chip elements 1a to 1d are, for example, card boards which are connected to the interface-network through the connectors 34a to 34d.

Figure 5A:
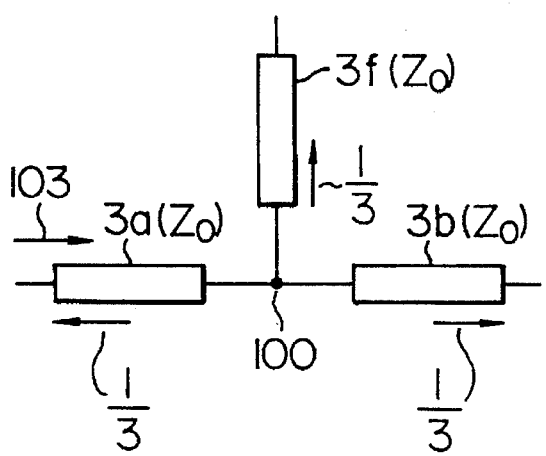
FIGS. 5A and 5B are explanatory diagrams for showing the equivalent circuit of the interface-network system shown in FIG. 4.
Figure 5B:
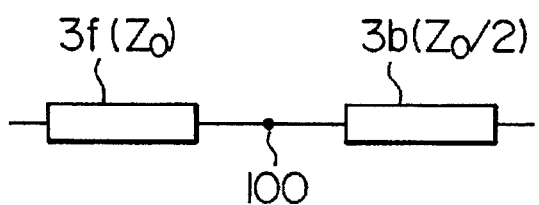

In the above-described interface-network structure, the transmission lines 3f to 3i generate reflection noise in such a way as to divide the signal change-over energy into almost one third, as shown by arrows, to the transmission of signals shown by an arrow 103 at branch points with the transmission lines 3a to 3e. In other words, the reflection noise is generated in such a way as to divide the signal change-over energy into each of the three transmission lines at the branch points. FIG. 5A shows an equivalent circuit of the transmission lines 3a, 3b and 3f, as an example. When the characteristic impedance of each of the transmission lines 3a, 3b and 3f is ZO, a reflection coefficient at a point 100 becomes as follows. The characteristic impedance of the two transmission lines 3f and 3b branched at the point 100 becomes (½) $Z_o$ as shown in FIG. 5B, and the reflection coefficient at the point 100 becomes $\{(½)\ Z_o-Z_o\}/\{(½)\ Z_o+Z_o\}=-(½)\ Z_o/(3/2)\ Z_o=-⅓$. As a result, reflection noise of each one third occurs at the branch point 100, as shown in FIG. 5A.

Multiple reflection of noise occurs when there are a plurality of such branch points. This noise energy is absorbed by an output impedance of the output circuit which transmitted a signal, with an extremely good focusing of noise.

Figure 6:
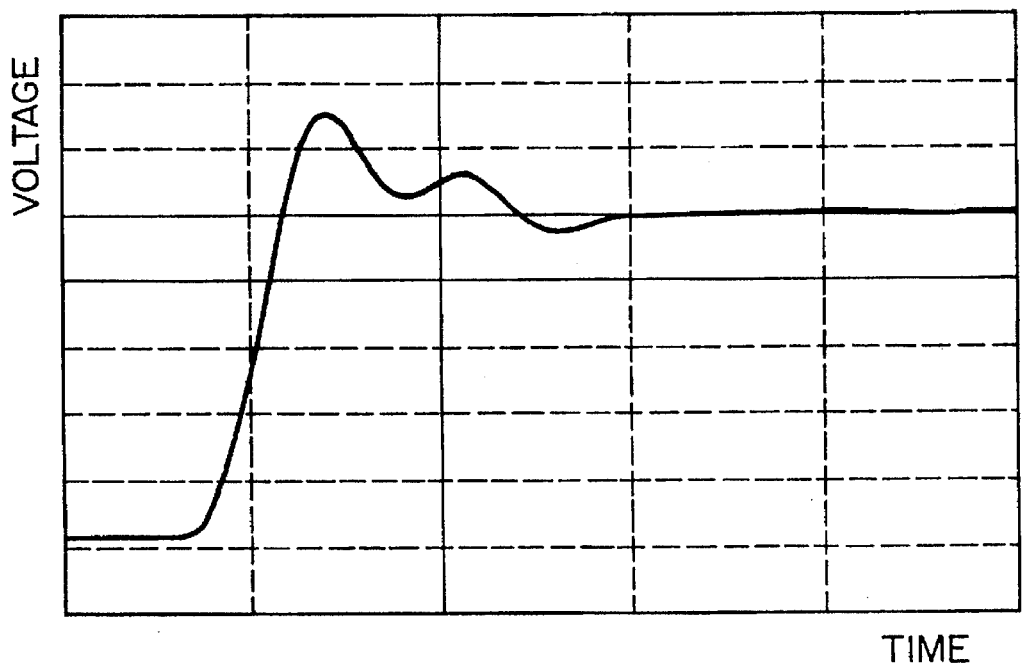
FIG. 6 is a waveform diagram for showing a waveform of the output signal of the interface circuit in the interface-network system shown in FIG. 3.

FIG. 6 shows a signal waveform which was measured by a connection terminal 101 in the interface circuit shown in FIG. 3. This waveform has a relatively small oscillation noise. The waveform in FIG. 6 was measured based on the structure of the interface-network shown in FIG. 1.

Since the push-pull circuit of the present invention is structured by the NMOS, this circuit has a fast operation speed and the circuit can be structured in a highly integrated circuit.

Figure 11:
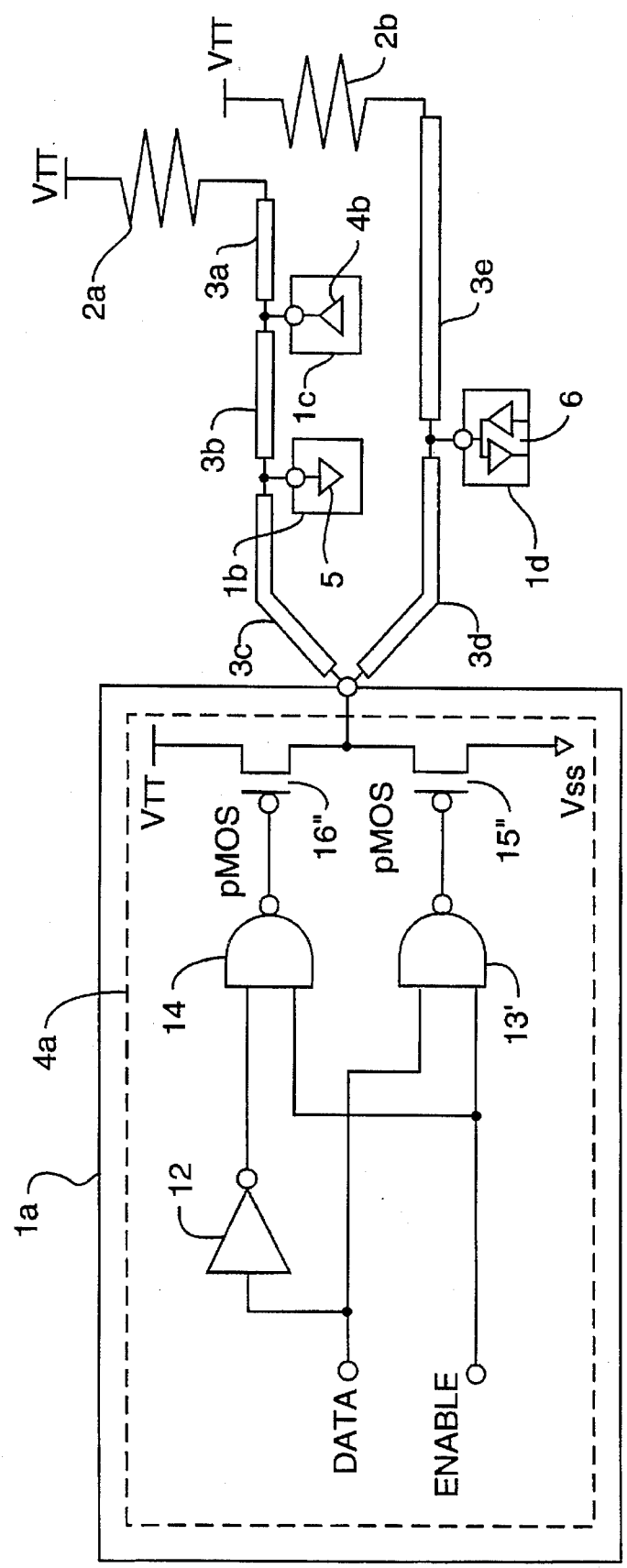
FIG. 11 is another structure diagram for showing the interface structure of the present invention and the interface-network system which uses the interface circuit.

As described above, the push-pull circuit uses NMOS transistors 15, 16, but PMOS transistors may also be used for the push-pull circuit, as shown in FIG. 11.

Figure 4:
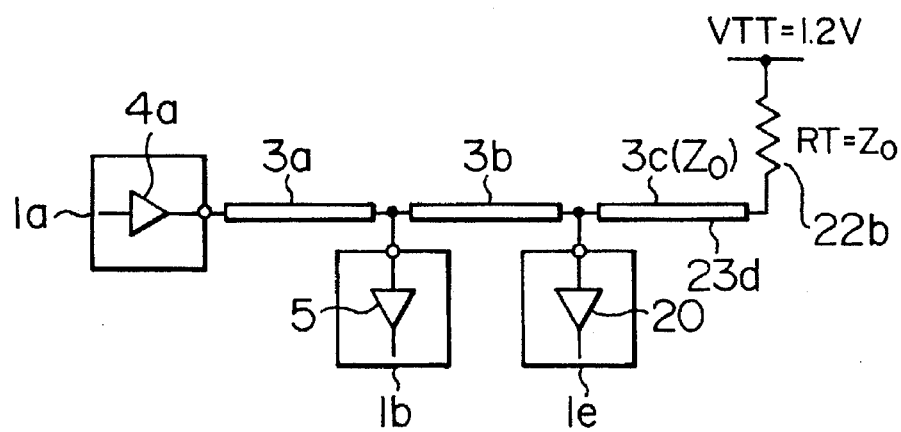
FIG. 4 is a structure diagram for showing still another example of the interface-network system.

FIG. 4 shows a structure of the interface-network in which the output circuit 4a is connected to one end of the transmission line 3a and the terminal resistor 2b is provided in only the other end of the transmission line 3d through the transmission line 3b. In this case, the voltage level at one end of the transmission line 3a is set to the power source voltage VTT of the output circuit 4a.

Next, the characteristic of the present invention that the interface circuit of the present invention requires only low power consumption during a high-speed operation will be explained in detail.

Figure 7:
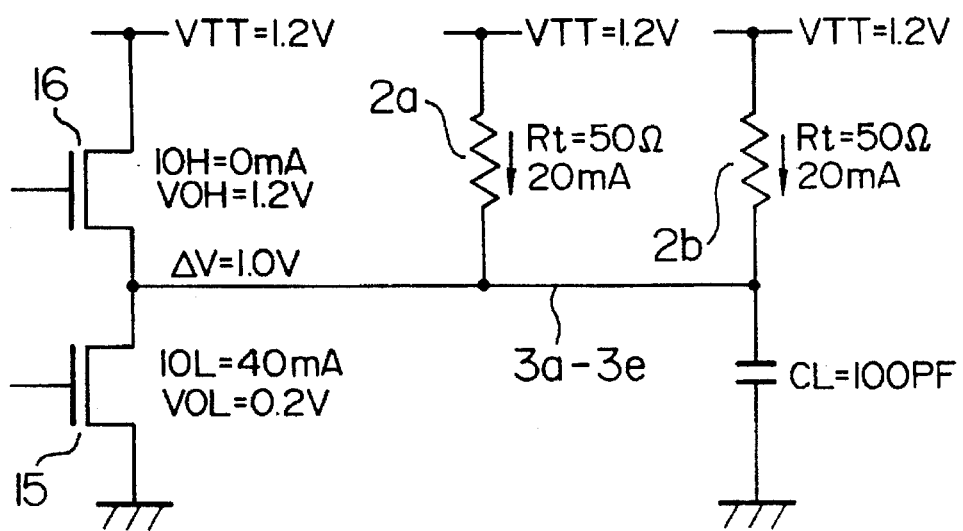
FIG. 7 is an explanatory diagram for showing the equivalent circuit of the interface circuit shown in FIG. 1.

FIG. 7 shows a model of the interface-network shown in FIG. 1 for estimating the power consumption of the present invention. In FIG. 7, voltage at both ends of the transmission lines 3a to 3e is defined by the terminal voltage VTT=1.2 V through the terminal resistors 2a and 2b (Rt=50 Ω) and the push-pull circuit of the NMOS transistors 15 and 16 is connected to the voltage VTT=1.2 V. CL designates a load capacity (100 pF), IOH designates an output current (0 mA) when the output of the terminal 17 is at a high level, VOH designates a potential (1.2 V) when the output of the terminal 17 is at a high level, AV designates an amplitude of a signal, IOL designates an output current (40 mA) when the output of the terminal 17 is at a low level, and VOL designates a potential (0.2 V) when the output of the terminal 17 is at a low level. Power consumption is calculated based on the assumption that a current of 20 mA flows to the terminal resistors 2a and 2b (Rt). The calculation method is cited from the method described in The Increasing in the Interface Speed, M. Yamada, issued by the Institute of Electronic Information and Communication Engineers of Japan, Vol. 76 No. 7, July 1993, pp 721–725.

Power consumption (Total) becomes a sum of the power consumption W (Device) of the output portion and the power consumption W (Resistor) of the terminal resistor 2a and 2b.

$$W(Total)=W(Device)+W(Resister)$$

For W (Device), $$W(Device)=W(DC)+W(AC),$$

for W (DC), $$W(DC) = IOL*VOL*(1\text{-Duty}) + IOH*(VTT-VOH)*\text{Duty},$$

for W (AC), $$W(AC) = 0.5*f*CL(\Delta V)^2, \text{and}$$

for W (Resistor), $$W(\text{Resistor}) = 0.5*(1\text{-Duty})*Rt*IOL^2 + 0.5*\text{Duty}*Rt*IOH^2,$$

where Duty represents a proportion of the period when the output is at a high level, and f represents an operation frequency.

Figure 8:
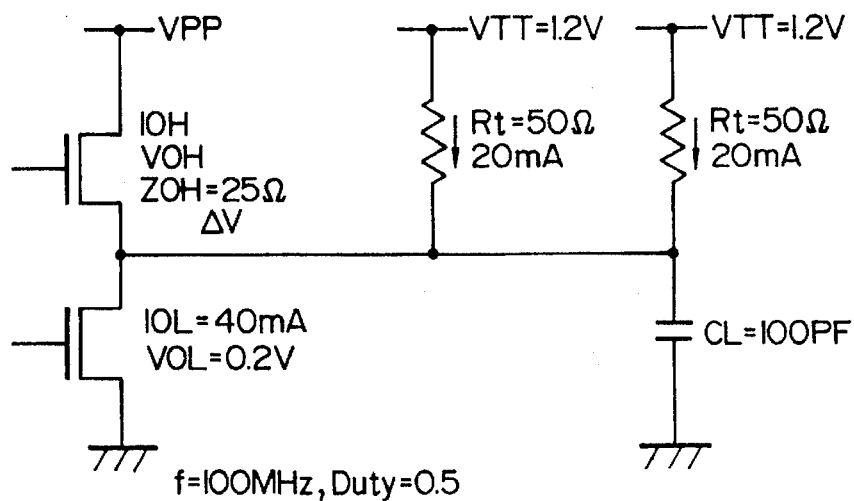
FIG. 8 is an explanatory diagram of the equivalent circuit for showing an example of the case where the power source voltage of the transistor in the interface circuit shown in FIG. 1 is set to a voltage which is different from the terminal voltage.

Based on the above-described numerical conditions, the power consumption is calculated as follow:

$W(\text{Device}) = 4.0 + 0.05 * f(\text{MHz})[\text{mW}]$
$W(\text{Resistor}) = 20[\text{mW}]$
$W(\text{Total}) = W(\text{Device}) + W(\text{Resistor}) = 24 + 0.05 * f(\text{MHz})[\text{mW}].$ FIG. 8 shows a model for estimating the power consumption when the power source voltage of the push-pull circuit structured by the NMOS transistors 15 and 16 is set to VPP. (In this case, the power source voltage VTT of the output circuit 4a in FIG. 1 is replaced with the power source voltage VPP). Each symbol mark in FIG. 8 is the same as that defined in the above, and power consumption is calculated by the following expressions based on the values shown in FIG. 8. ZOH represents an impedance of the NMOS transistors 15 and 16 when the terminal 17 is at a high level.

Figure 9:
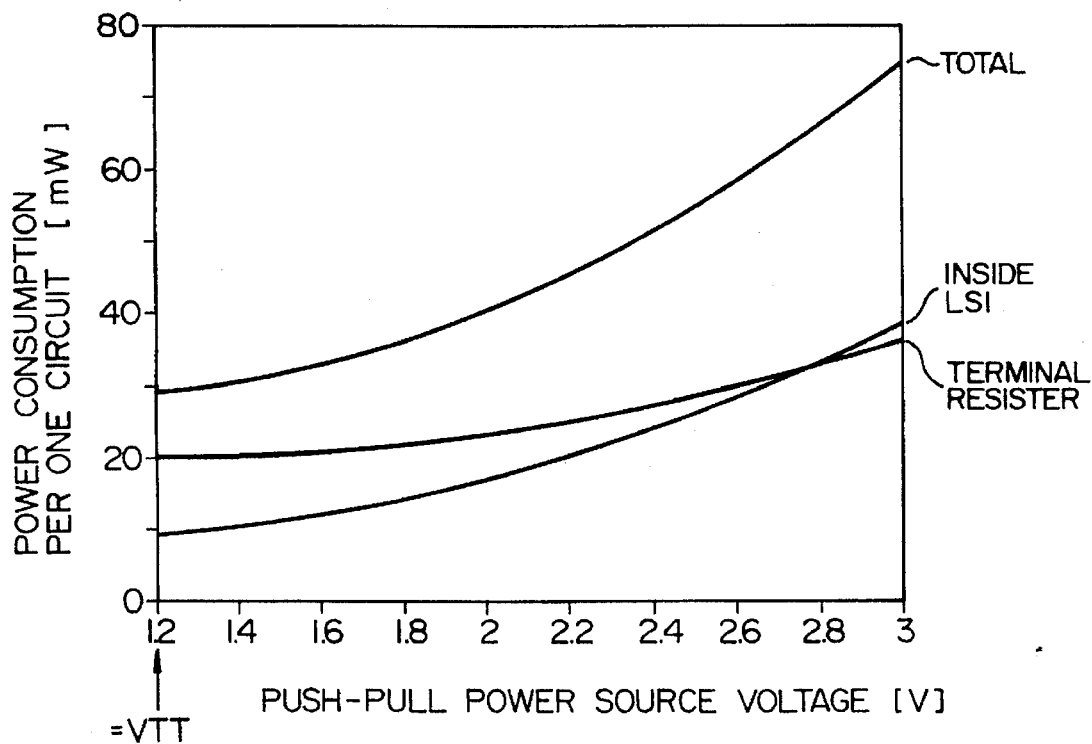
FIG. 9 is a graph for showing changes of the power consumption of the interface circuit shown in FIG. 8.

$VOH = (VPP + VTT)/2$
$IOH = (VPP - VTT)/(ZOH + 0.5 * Rt)$
$\Delta V = VOH - VOL$
$W(\text{Total}) = W(\text{Device}) + W(\text{Resistor})$
$W(\text{Device}) = W(DC) + W(AC)$
$W(DC) = IOL * VOL * (1\text{-Duty}) + IOH * (VPP - VOH) * \text{Duty}$
$W(AC) = 0.5 * f * CL (\Delta V)^2$
$W(\text{Resistor}) = 0.5 * (1\text{-Duty}) * Rt * IOL^2 + 0.5 * \text{Duty} * Rt * IOH^2,$ FIG. 9 shows changes of power consumption per one circuit when the power source voltage VPP of the push-pull circuit has been changed from 1.2 V (this is equal to VTT) to 3 V. As is clear from FIG. 9, when the power source voltage VPP is not higher than 2.2 V, the power consumption (W (Device)) within the LSI can be restricted to within two times as compared with the above-described case of VPP=VTT (1.2 V). Further, the total power consumption including the terminal resistor component (W (Resistor)) can be restricted to not higher than 1.5 times as compared with the case of VPP=VTT (1.2 V). Accordingly, when the power source voltage VPP of the push-pull circuit is restricted to not higher than 2.2 V, the power consumption can be minimized without losing the advantage of the GTL.

The power source voltage VTT of the push-pull circuit structured by the n-channel MOS transistors 15 and 16 can be made smaller than the power source voltage of the NOR gates 13 and 14 and the inverters 11 and 12 other than the push-pull circuit or other electronic circuits not shown.

The power source voltage VTT of the push-pull circuit can be made larger than 60% of the terminal voltage VTT of the terminal circuit structured by the terminal resistors 2a and 2b.

As shown in FIG. 1, the power source voltage VTT of the push-pull circuit can be set to be equal to the terminal voltage.

The output impedance of the on-state n-channel MOS transistors 15 and 16 to which the power source voltage VTT of the push-pull circuit has been applied, may be set to not higher than three times of the characteristic impedance of the transmission lines 3a to 3e.

The output impedance of the on-state n-channel MOS transistors 15 and 16 to which the power source voltage VTT of the push-pull circuit has been applied, can be set to be equal to the characteristic impedance of the transmission lines 3a to 3e.

Further, a DISABLE state is provided for disabling the output circuit 4a from outputting a signal so that the output impedance of the push-pull circuit is a high impedance. In other words, the DISABLE state is the state when there is no above-described ENABLE signal. FIG. 11 illustrates a structure that is very similar to that shown in FIG. 1, except that n-channel MOS transistor 16 is replaced with p-channel MOS transistor 16'. Of course, due to the structure of p-channel MOS transistors, the inputs (DATA and ENABLE) going into transistor 16' are inverted relative to their state in FIG. 1, where they are shown going into transistor 16. Otherwise, the operation of the circuits of FIGS. 1 and 11 are identical.

What is claimed is:

1. An interface circuit including at least one signal processing unit connected to a transmission line connected with a terminal circuit having a resistor with a terminal voltage supplied from a terminal voltage source applied to at least one terminal of said transmission line, and said signal processing unit having at least an input circuit for inputting a signal to be processed from said transmission line or an output circuit for outputting a processed signal to said transmission line or an input and an output circuit for inputting and outputting a signal for each, and said input circuit, output circuit and input and output circuits being directly connected to said transmission line, wherein a value of said resistor connected between said transmission line and said terminal voltage source is substantially equal to a characteristic impedance of said transmission line; and wherein said output circuit in said signal processing unit includes a push-pull circuit, a power source voltage of which is set to be equal to a voltage of said terminal circuit such that a signal for outputting from said at least one signal processing unit is outputted to said transmission line regardless of an impedance of said terminal circuit and said characteristic impedance of said transmission line.

2. An interface circuit according to claim 1, wherein a power source voltage of said push-pull circuit is set to be smaller than a power source voltage of an electronic circuit other than said push-pull circuit.

3. An interface circuit according to claim 2, wherein a power source voltage of said push-pull circuit is set to be larger than 60% of the terminal voltage of said terminal circuit.

4. An interface circuit according to claim 1, wherein a power source voltage of said push-pull circuit is set to be equal to the terminal voltage of said terminal circuit.

5. An interface circuit according to claim 1, wherein said push-pull circuit comprises an n-channel MOS pull-up transistor and an n-channel MOS pull-down transistor.

6. An interface circuit according to claim 5, wherein each of said n-channel MOS transistor which constitute said push-pull circuit has a characteristic that each of said n-channel MOS transistor sets an output impedance of said n-channel MOS transistor in an on state, to which a power source voltage of said push-pull circuit has been applied, to be not larger than three times of a characteristic impedance of said transmission line.

7. An interface circuit according to claim 5, wherein each of said n-channel MOS transistors which constitute said push-pull circuit has a characteristic that each of said n-channel MOS transistor sets an output impedance of said n-channel MOS transistor in an on state, to which a power source voltage of said push-pull circuit has been applied, to be equal to a characteristic impedance of said transmission line.

8. An interface circuit according to claim 1, wherein said interface circuit includes DISABLE means for disabling said output circuit from outputting a signal so that said output impedance of said push-pull circuit is a high impedance.

9. An interface circuit according to claim 1, wherein said push-pull circuit comprises a p-channel MOS pull-up transistor and a p-channel MOS pull-down transistor.

10. An interface circuit according to claim 9, wherein each of said p-channel MOS transistor which constitute said push-pull circuit has a characteristic that each of said p-channel MOS transistor sets an output impedance of said p-channel MOS transistor in an on state, to which a power source voltage of said push-pull circuit has been applied, to be not larger than three times of a characteristic impedance of said transmission line.

11. An interface circuit according to claim 9, wherein each of said p-channel MOS transistors which constitute said push-pull circuit has a characteristic that each of said p-channel MOS transistor sets an output impedance of said p-channel MOS transistor in an on state, to which a power source voltage of said push-pull circuit has been applied, to be equal to a characteristic impedance of said transmission line.

12. An interface circuit according to claim 1, wherein said terminal voltage is greater or equal to 0.5 volt.

13. An interface circuit according to claim 12, wherein said terminal voltage lies within a range from 1.2 to 2.0 volt.

* * * * *